(12) United States Patent
Mistkawi et al.

(10) Patent No.: US 8,426,319 B2
(45) Date of Patent: Apr. 23, 2013

(54) COMPOSITION FOR ETCHING A METAL HARD MASK MATERIAL IN SEMICONDUCTOR PROCESSING

(75) Inventors: Nabil G. Mistkawi, Keizer, OR (US); Lourdes Dominguez, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 722 days.

(21) Appl. No.: 12/156,060

(22) Filed: May 28, 2008

(65) Prior Publication Data

US 2008/0318435 A1    Dec. 25, 2008

Related U.S. Application Data

(62) Division of application No. 11/393,179, filed on Mar. 29, 2006, now Pat. No. 8,025,811.

(51) Int. Cl.
    *H01L 21/302*    (2006.01)
(52) U.S. Cl.
    USPC ............ 438/754; 438/745; 438/756; 216/107
(58) Field of Classification Search .......... 438/745, 438/750, 752, 754, 756; 216/100, 107
    See application file for complete search history.

(56) References Cited

U.S. PATENT DOCUMENTS

| | | | |
|---|---|---|---|
| 5,803,980 A * | 9/1998 | Pas et al. ........................ 134/2 |
| 5,912,506 A | 6/1999 | Colgan et al. |
| 6,136,711 A | 10/2000 | Grumbine et al. |
| 6,383,928 B1 | 5/2002 | Eissa |
| 6,443,807 B1 | 9/2002 | Sakai et al. |
| 6,461,533 B1 | 10/2002 | Horiike et al. |
| 6,492,270 B1 * | 12/2002 | Lou ............................. 438/687 |
| 6,783,694 B1 | 8/2004 | Lee et al. |
| 6,867,142 B2 | 3/2005 | Chen et al. |
| 7,018,560 B2 | 3/2006 | Liu et al. |
| 7,223,685 B2 * | 5/2007 | Andryushchenko et al. . 438/622 |
| 2001/0034089 A1 | 10/2001 | Yamazaki et al. |
| 2002/0017064 A1 | 2/2002 | Shimaza et al. |
| 2002/0055262 A1 | 5/2002 | Lee et al. |

(Continued)

FOREIGN PATENT DOCUMENTS

| | | |
|---|---|---|
| JP | 2004-172576 | 6/2004 |
| JP | 2005-097715 | 4/2005 |
| KR | 10-0278561 | 10/2000 |
| WO | WO 2006/086996 | 8/2006 |

OTHER PUBLICATIONS

PCT International Preliminary Report on Patentability and Written Opinion for International Application No. PCT/US2007/064338, mailed Sep. 30, 2008, 7 pages.
PCT International Search Report for International Application No. PCT/US2007/064338, mailed Aug. 7, 2007, 4 pages.

(Continued)

*Primary Examiner* — Lan Vinh
(74) *Attorney, Agent, or Firm* — Blakely, Sokoloff, Taylor & Zafman LLP

(57) ABSTRACT

An etching solution for a metal hard mask. The etching solution comprises a mixture of a dilute HF (hydrofluoric acid) and a silicon containing precursor. The etching solution also comprises a surfactant agent, a carboxylic acid, and a copper corrosion inhibitor. The etching solution is selectively toward etching the metal hard mask material (e.g., Titanium) while suppressing Tungsten, Copper, oxide dielectric material, and carbon doped oxide.

19 Claims, 17 Drawing Sheets

U.S. PATENT DOCUMENTS

| | | |
|---|---|---|
| 2002/0060307 A1 | 5/2002 | Lee et al. |
| 2002/0104268 A1 | 8/2002 | Tsuchiya et al. |
| 2003/0049938 A1 | 3/2003 | Lai et al. |
| 2003/0153188 A1* | 8/2003 | Shimazu et al. ............ 438/692 |
| 2004/0214443 A1* | 10/2004 | Grumbine et al. ........... 438/692 |
| 2005/0032464 A1 | 2/2005 | Swisher et al. |
| 2005/0066585 A1 | 3/2005 | Bian et al. |
| 2005/0070110 A1* | 3/2005 | Ohtorii et al. ............... 438/695 |
| 2005/0211952 A1 | 9/2005 | Mace et al. |
| 2006/0163530 A1 | 7/2006 | Liu |
| 2008/0207005 A1 | 8/2008 | Farkas |

OTHER PUBLICATIONS

Japanese Patent Application No. 2008-555541, English Translation of Office Action dated May 10, 2011, 4 pages.

* cited by examiner

Amino Functional Silanes

| AMINOPROPYLTRIETHOXYSILANE |
|---|
|  |
| AMINOPROPYLTRIMETHOXYSILANE |
|  |
| AMINOPROPYLMETHYLDIETHOXYSILANE |
|  |
| AMINOPROPYLMETHYLDIMETHOXYSILANE |
|  |
| AMINOETHYLAMINOPROPYLTRIMETHOXYSILANE |
|  |
| AMINOETHYLAMINOPROPYLTRIETHOXYSILANE |
|  |
| AMINOETHYLAMINOPROPYLMETHYLDIMETHOXYSILANE |
|  |

| CYCLOHEXYLAMINOPROPYLTRIMETHOXYSILANE |
|---|
| ⬡-NH-(CH$_2$)$_3$-Si(-OCH$_3$)(-OCH$_3$)(-OCH$_3$) |

| DIETHYLENETRIAMINOPROPYLTRIMETHOXYSILANE |
|---|
| H$_2$N-(CH$_2$)$_2$-N(H)-(CH$_2$)$_2$-N(H)-(CH$_2$)$_3$-Si(-OCH$_3$)(-OCH$_3$)(-OCH$_3$) |

| DIETHYLENETRIAMINOPROPYLTRIETHOXYSILANE |
|---|
| H$_2$N-(CH$_2$)$_2$-N(H)-(CH$_2$)$_2$-N(H)-(CH$_2$)$_3$-Si(-OC$_2$H$_5$)(-OC$_2$H$_5$)(-OC$_2$H$_5$) |

| DIETHYLENETRIAMINOPROPYLMETHYLDIMETHOXYSILANE |
|---|
| H$_2$N-(CH$_2$)$_2$-N(H)-(CH$_2$)$_2$-N(H)-(CH$_2$)$_3$-Si(-CH$_3$)(-OCH$_3$)(-OCH$_3$) |

| DIETHYLENETRIAMINOPROPYLMETHYLDIETHOXYSILANE |
|---|
| H$_2$N-(CH$_2$)$_2$-N(H)-(CH$_2$)$_2$-N(H)-(CH$_2$)$_3$-Si(-CH$_3$)(-OC$_2$H$_5$)(-OC$_2$H$_5$) |

FIG. 7B

| HEXANEDIAMINOMETHYLTRIETHOXYSILANE |
|---|
|  |
| PHENYLAMINOMETHYLTRIMETHOXYSILANE |
|  |
| PHENYLAMINOMETHYLTRIETHOXYSILANE |
|  |
| DIETHYLAMINOMETHYLTRIETHOXYSILANE |
|  |
| DIETHYLAMINOMETHYLIMETHYLDIETHOXYSILANE |
|  |
| METHYLAMINOPROPYLTRIMETHOXYSILANE |
|  |

Epoxy Functional Silanes

| GLYCIDOXYPROPYLTRIMETHOXYSILANE |
|---|
|  |
| GLYCIDOXYPROPYLTRIETHOXYSILANE |
|  |
| GLYCIDOXYPROPYLMETHYLDIETHOXYSILANE |
|  |
| GLYCIDOXYPROPYLMETHYLDIMTHOXYSILANE |
|  |

Vinlyl Functional Silanes

| VINYLTRIMETHOXYSILANE |
|---|
|  |
| VINYLTRIETHOXYSILANE |
|  |
| VINYLTRISI2-METHOXYETHOXYLSILANE |
|  $(CH_3O\text{-}CH_2CH_2O)_3\text{-}Si\text{-}CH=CH_2$ |

ALKOXY SILANES

METHYLTRIMETHOXYSILANE

METHYLTRIETHOXYSILANE

TETRAMETHOXYSILANE (TMOS)

TETRAETHOXYSLANE (TEOS)

TETRAPROPOXYSILANE

KETOXIME SILANES

METHYLTRIS(METHYLETHYLKETOXIME)SILANE (MOS)

METHYLTRIS(ACETOXIME)SILANE

METHYLTRIS(METHYLISOBUTYLXETOXIME)SILANE

DIMETHYLD(METHYLETHYLKETOXIME)SILANE

TRIMETHYL(METHYLETHYLKETOXIME)SILANE

VINYLTRIS(METHYLETHYLKETOXIME)SILANE (VOS)

METHYLVINYLDI(METHYLETHYLKETOXIME)SILANE

| METHYLVINYLDI(CYCLOHEXANONEOXIME)SILANE |
|---|
|  |

| VINYLTRIS(METHYLISOBUTYLKETOXIME)SILANE |
|---|
|  |

| PHENYLTRIS(METHYLETHYLKETOXIME)SILANE (POS) |
|---|
|  |

ACETOXY SILANES

| METHYLTRIZACETOXYSILANE |
|---|
|  |

| TETRAACETOXYSILANE |
|---|
|  |

COMPOSITION FOR ETCHING A METAL HARD MASK MATERIAL IN SEMICONDUCTOR PROCESSING

This is a Divisional Application of Ser. No. 11/393,179 filed Mar. 29, 2006, which is presently pending.

BACKGROUND

1. Field

Embodiments of the present invention relate to etching of an integrated circuit structure. More particularly, embodiments of the present invention pertain to selective etching a metal hard mask layer used in fabricating an integrated circuit.

2. State of the Art

The fabrication of microelectronic devices involves forming electronic components on microelectronic substrates, such as silicon wafers. These electronic components may include transistors, resistors, capacitors, and the like, with intermediate and overlying metallization patterns at varying levels, separated by dielectric materials, which interconnect the electrical components to form integrated circuits. The metallization patterns are generally referred to as "interconnects."

One process used to form interconnects is known as a "damascene process". In a typical damascene process, a photoresist material is patterned on a dielectric material and the dielectric material is etched through the photoresist material patterning to form a hole or a trench (hereinafter collectively referred to as "an opening" or "openings"). The photoresist material is then removed (typically by an oxygen plasma or selective wet etching) and the opening is then filled with a conductive material (e.g., such as a metal or metal alloys). The filling of the opening may be accomplished by either physical vapor deposition, chemical vapor deposition, or electroplating, as will be understood to those skilled in the art. When the opening is a hole, the resulting filled structure is referred to herein as a "via". When the opening is a trench, the resulting filled structure is referred to herein as a "trace". The term "interconnect" is defined herein to include all interconnection components including traces and vias.

As devices approach smaller dimensions, critical dimensions for vias and trenches become harder to achieve. Metals such as Tantalum (Ta) and Titanium (Ti) and metallic compounds such as Tantalum Nitride (TaN) and Titanium Nitride (TiN) have been used to help integrated circuit (IC) manufacturers achieve the critical dimensions for forming small vias and trenches. Metals and metallic compounds have also been used as antireflective coating and/or barrier layers in many processes to form the trenches and vias. Thus, as IC manufacturing technology enters into 0.10 um and beyond technology nodes, it is desired that metals and metallic compounds are being used as hard mark layer.

There are several known methods used to etch a metal hard mask. One method uses a high density plasma reactor in conjunction with a chlorine containing plasma. This method requires using two reactors for an IC structure having a metal hard mask layer and a dielectric layer. For the metal hard mask layer, a high density plasma reactor is used and for the dielectric layer, a medium density plasma reactor is used. The method is thus costly and complicated.

Currently, no efficient and safe composition is available for selective wet etching a metal hard mask layer. If a wet etching composition is used, it suspected to be carcinogenic, toxic, and hard to handle. More importantly, the current wet etching process typically takes a long time (e.g., about 70 minutes or more) to remove a metal hard mask layer and even so, it is not as selective to the metal as desired.

Therefore, it would be advantageous to develop a composition that can safely and efficiently etch a metal hard mask layer.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

FIGS. 7A-7H illustrate chemical structures for various silicon precursors that can be used to make an etching composition in according to embodiments of the present invention;

DETAILED DESCRIPTION OF THE ILLUSTRATED EMBODIMENT

Figure 1:
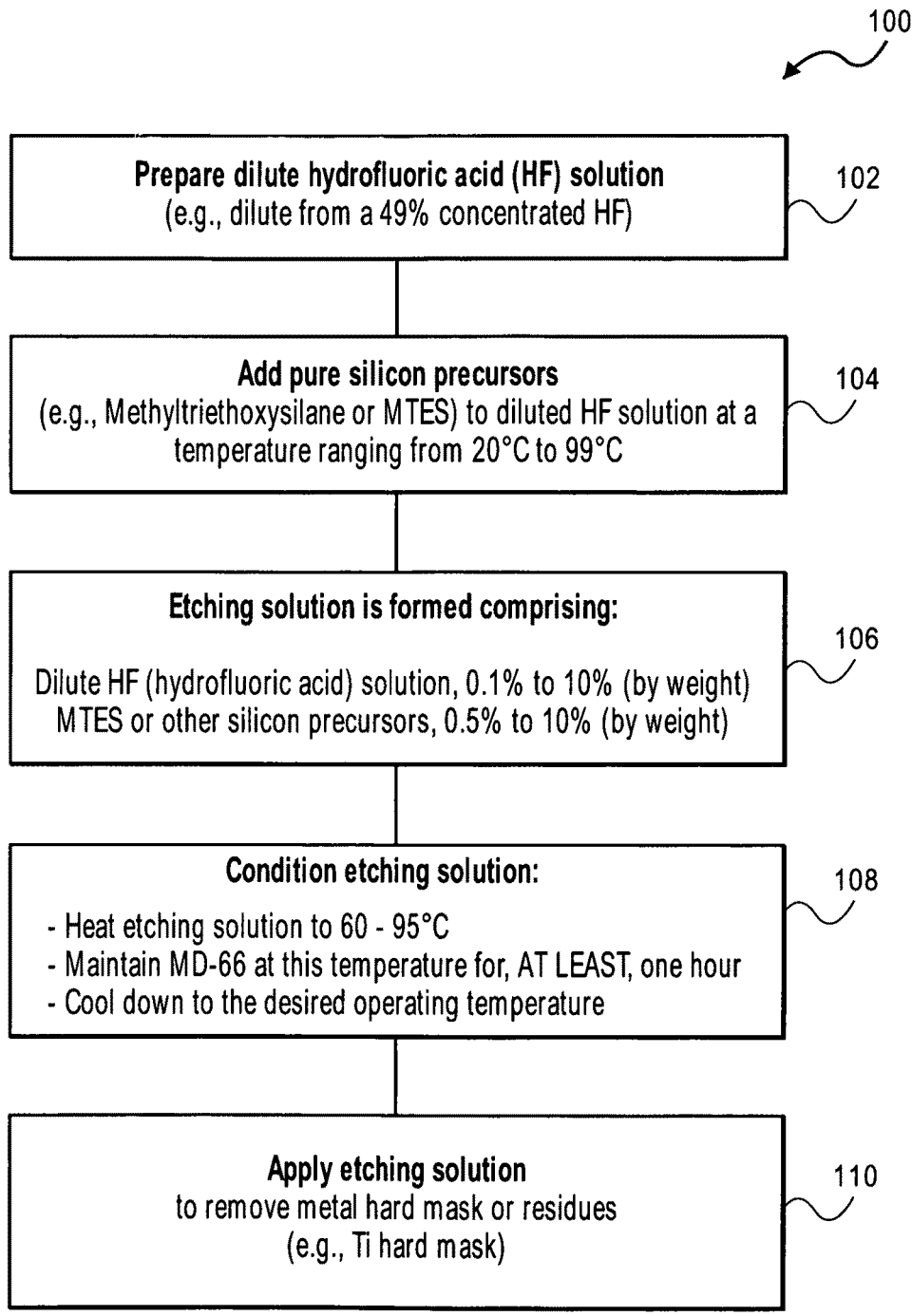
FIG. 1 illustrates an exemplary method of formulating an etching composition in according to embodiments of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Embodiments of the present invention pertain to a composition and method for etching an integrated circuit (IC) structure that includes a metal hard mask layer.

The metal hard mask layer includes metals or metallic compound such as Ti, Ta, TiN, or TaN, or the like.

The composition of the present invention electively etches a hard mask layer such as a Ti layer while suppressing a conductive interconnect material such as Tungsten (W), Copper (Cu), and dielectric materials such as glass silicate, oxide, silicon oxide (SiOx, or SiO2), and carbon doped oxide (CDO). The composition thus selectively etches the metal hard mask at a much faster rate (e.g., 10-100 times) faster than the rate of etching the W, Cu, and dielectric materials.

The composition of the present invention can also selectively etch a sacrificial light absorbing material (SLAM) with respect to polysilicon or other metal hard mask used in Replacement Metal Gate Applications.

In one embodiment, an etching solution is provided that selectively etches a hard mask layer (e.g., Ti) while suppressing the etching of W and dielectric materials. The etching solution comprises a mixture of dilute HF (hydrofluoric acid) and MTES (Methyltriethoxysilane), or similar silicon containing precursor. In one embodiment, the etching solution comprise the dilute HF solution with concentrations ranging from 0.1% to 49%, alternatively, 0.1% to 10% by weight, and MTES, or other silicon precursors with concentrations ranging from 0.0001% to 60%, alternatively, 0.5% to 10% by weight. The presence of the silicon precursors in the dilute HF solutions significantly suppresses the etch rate of a dielectric material such as SiOx or SiO2. Additionally, the dilute HF gives the solution a low pH (e.g., 1-3), which significantly inhibits W dissolution without adversely impacting the etch rate of the metal hard mask. The etching solution of the present embodiment can be applied as a wet etch solution for a metal hard mask in patterning schemes involving dielectric films and W contacts.

In one embodiment, an etching solution is provided that selectively etches a hard mask layer (e.g., Ti) while suppressing the etching of W, Cu, and dielectric materials. The etching solution comprises a mixture of a dilute HF and MTES, or similar silicon containing precursor, a surfactant/emulsifying agent, a carboxylic acid, and a copper corrosion inhibitor. In one embodiment, the etching solution comprises the dilute HF solution with concentrations ranging from 0.001% to 49% by weight, the MTES with concentration ranged from 0.0001% to 60% by weight, the copper corrosion inhibitor with concentration ranged from 0.0001% to 20% by weight, the surfactant/emulsifying agent with concentrations ranging from 0.0001% to 50% by weight, and the carboxylic acid with concentrations ranging from 0.0001% to 50% by weight. The addition of the surfactants/emulsifying agents aids in the mixing of dilute HF with MTES to form a homogenous solution. The addition a carboxylic acid slows down and prevents an unwanted side reaction, which may result in the formation of polymers. The presence of MTES and copper corrosion inhibitor in dilute HF solutions significantly suppresses the etch rate of a dielectric material such as SiOx or SiO2 or CDO, and inhibits Cu dissolution without adversely impacting the etch rate of the metal hard mask. As before, the dilute HF gives the solution a low pH (e.g., 1-3), which significantly inhibits W dissolution. The etching solution of the present embodiment can be applied as a wet etch solution for a metal hard mask in patterning schemes involving dielectric films and W and/or Cu contacts/metal lines.

Silicon precursors that can be used for the etching solutions of the present invention include Amino Functional Silanes, Epoxy Functional Silanes, Vinyl Functional Silanes, Alkoxy Silanes, Ketoxime Silanes, Acetoxy Silanes, Diethylsilane, and Diphenylsilane.

An Amino Functional Silane can be Aminopropyltriethoxysilane, Aminopropyltrimethoxysilane, Aminopropylmethyldiethoxysilane, Aminopropylmethyldimethoxysilane, Aminoethylaminopropyltrimethoxysilane, Aminoethylaminopropyltriethoxysilane, Aminoethylaminopropylmethyldimethoxysilane, Diethylenetriaminopropyltrimethoxysilane, Diethylenetriaminopropyltriethoxysilane, Diethylenetriaminopropylmethyldimethoxysilane, Diethylenetriaminopropylmethyldimethoxysilane, Diethylenetriaminopropylmethyldiethoxysilane, Cyclohexylaminopropyltrimethoxysilane, Hexanediaminomethyltriethoxysilane, Phenylaminomethyltrimethoxysilane, Phenylaminomethyltriethoxysilane, Diethylaminomethyltriethoxysilane, (Diethylaminomethyl)methyldiethoxysilane, and Methylaminopropyltrimethoxysilane.

An Epoxy Functional Silane can be Glycidoxypropyltrimethoxysilane, Glycidoxypropyltriethoxysilane, Glycidoxypropylmethyldiethoxysilane, and Glycidoxypropylmethyldimthoxysilane.

A Vinyl Functional Silane can be Vinyltrimethoxysilane, Vinyltriethoxysilane, and Vinyltris(2-methoxyethoxy)silane.

An Alkoxy Silane can be Methyltrimethoxysilane, Methyltriethoxysilane, Tetramethoxysilane (TMOS), Tetraethoxysilane (TEOS), and Tetrapropoxysilane.

A Ketoxime Silane can be Methyltris(methylethylketoxime)silane (MOS), Methyltris(acetoxime)silane, Methyltris(methylisobutylketoxime)silane, Dimethyldi(methylketoxime)silane, Trimethyl(methylethylketoxime)silane, Vinyltris(methylethylketoxime)silane (VOS), Methylvinyldi(methylethylketoxime)silane, Methylvinyldi(cyclohexanoneoxime)silane, Vinyltris(methyllisobutylketoxime)silane, and Phenyltris(methylethylketoxime)silane (POS).

An Acetoxy Silane can be Methyltriacetoxysilane and Tetraacetoxysilane.

Surfactants or emulsifying agents that can be used for the etching solutions of the present invention include alcohols, amines, amides, esters, ketones, aldehydes, carboxylic acids, and ethers.

Copper corrosion inhibitors that can be used for the etching solutions of the present invention include 2-Mercaptobenzothiazole, 2-Mercaptobenzimidazole, 5-chlorobenzotriazole, 5-methylbenzotriazole, Benzotriazole, Carboxybenzotriazole, Tolyltriazole, 1-Phenyl-1H-tetrazole-5-thiol, and hexadecyltrimethylammonium bromide.

FIG. 1 illustrates an exemplary method 100 of formulating an etching solution in according to embodiments of the present invention. The etching solution in the present embodiment is selective to etching a metal hard mask layer (e.g., Ti mask) while suppressing the etching of conductive material (e.g., W plug) and dielectric layers (e.g., $SiO_2$ and CDO). At 102, a dilute HF solution is prepared. For example, the dilute HF is obtained from diluting a 49% concentrated HF to a desired concentration. At 104, a pure silicon precursor is added to the solution. In one embodiment, Methyltriethoxysilane (MTES) is the silicon precursor and is added to the diluted HF solution at a temperature ranging form 20° C. to 99° C. At 106, an etching solution is formed. In one embodiment, the etching solution comprises dilute HF solution with a concentration of 0.1% to 10% by weight and MTES (or other silicon precursor) with a concentration of 0.5% to 10% by weight. At 108, the etching solution is conditioned. In one embodiment, the etching solution is heated to a temperature ranging between about 60-99° C. The etching solution is then maintained at this temperature for at least one hour before use. Then, the etching solution is allowed to cool down to a desired operating temperature. At 110, the etching solution is applied to a wet etch process to remove a metal hard mask such as a Ti hard mask or the residues thereof.

The heating of the etching solution at 108 is desired to drive the reaction (Equation 1) that forms the etching solution and promotes conditioning of the etching solution. The silicon precursor such as MTES breaks down kinetics at a higher temperature thus enhancing the formation of silicic acid and gives the etching solution its selectivity characteristic in etching metal.

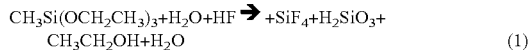
$$CH_3Si(OCH_2CH_3)_3 + H_2O + HF \rightarrow SiF_4 + H_2SiO_3 + CH_3CH_2OH + H_2O \quad (1)$$

Figure 2:
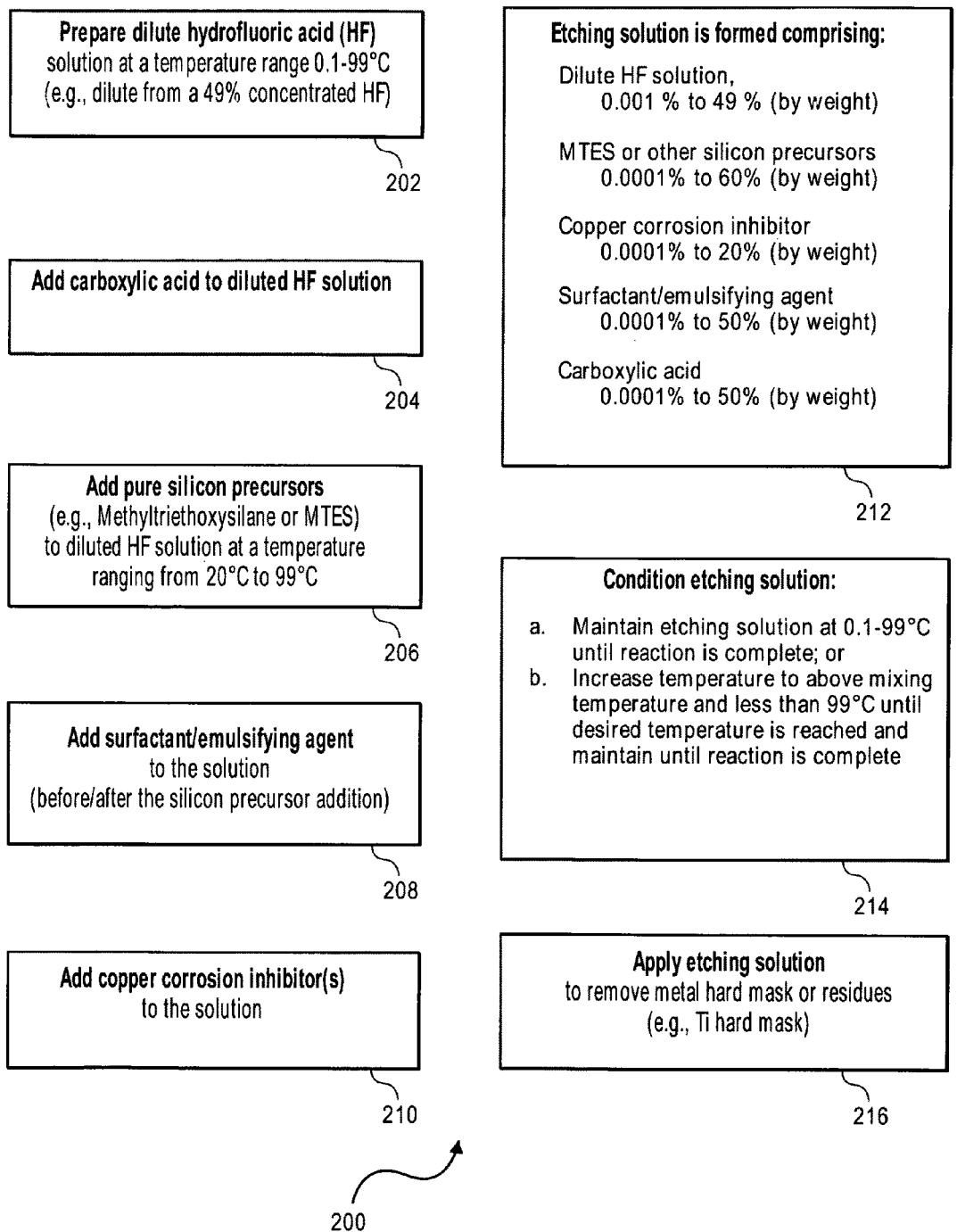
FIG. 2 illustrates an exemplary method of formulating an etching composition in according to embodiments of the present invention.

FIG. 2 illustrates an exemplary method 200 of formulating an etching solution in according to embodiments of the present invention. The etching solution in the present embodiment is selective to etching a metal hard mask layer (e.g., Ti mask) while suppressing the etching of a dielectric layer (e.g., $SiO_2$ and CDO,) and the etching of conductive material (e.g., W plug and Cu contact/metal lines), and especially suppresses the corrosion of the conductive material. The etching solution made according method 200 is similar to method 100 with the additions of more particular selectively suppressing the etching or corrosion of Cu. At 202, a dilute HF solution is prepared. For example, the dilute HF is obtained from diluting a 49% concentrated HF to a desired concentration. In one embodiment, the diluted HF solution is prepared at a temperature ranging from 0.1° C.-99° C.

At 204, a carboxylic acid (CA) is added to the diluted HF solution. At 206, a pure silicon precursor (e.g., MTES) is added to the diluted HF solution having the carboxylic acid added therein. In one embodiment, the addition of the silicon precursor is carried out at a temperature ranging from 20° C. to 99° C. At 208, a surfactant or an emulsifying agent is added to the solution. The surfactant or an emulsifying agent (SA) can be added before or after the addition of the silicon precursor. At 210, a copper corrosion inhibitor (CI) is added to the solution.

At 212, an etching solution is formed. In one embodiment, the etching solution comprises dilute HF solution with a concentrations ranging from 0.001% to 49% by weight, MTES with a concentration ranged from 0.0001% to 60% by weight, copper corrosion inhibitor with a concentration ranged from 0.0001% to 20% by weight, surfactant or emulsifying agent with a concentration ranging from 0.0001% to 50% by weight, and carboxylic acid with a concentration ranging from 0.0001% to 50% by weight.

At 214, the etching solution is conditioned. In one embodiment, once all of the etching solution constituents are added, the temperature is maintained at that temperature which can range from 0.1° C. to 99° C. for a length of time until the reaction is complete. The reaction temperature is maintained for at least 1 minute and can go for up to 72 hours depending on the reaction temperature. Alternatively once all the etching solution constituents are added, the temperature is then increased to a temperature above the mixing temperature up to 99° C. Once the desired temperature is reached, it will be maintained until the reaction is completed. Then, the etching solution is allowed to cool down to a desired operating temperature. At 110, the etching solution is applied to a wet etch process to remove a metal hard mask such as a Ti hard mask or the residues thereof. In one embodiment, the etch rate of the metal hard mask is controlled by controlling the temperature of the etching solution and/or the temperature of the etching condition.

The synthesis of the etching solution and its reaction rate is temperature dependent and it is what drives the following reaction (Equation 2) and promotes conditioning:

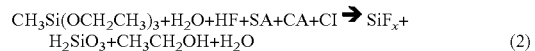
$$CH_3Si(OCH_2CH_3)_3 + H_2O + HF + SA + CA + CI \rightarrow SiF_x + H_2SiO_3 + CH_3CH_2OH + H_2O \quad (2)$$

The silicon precursor breaks down kinetics at higher temperatures and enhances the formation of Silicic acid in a shorter time and gives the etching solution its unique selective characteristics for etching a metal hard mask and not the W or Cu contact and the dielectric materials. The carboxylic acid is helpful in the prevention of unwanted precipitation or polymerization side reaction. The presence of surfactants/emulsifying agents is a key element to successful mixing of the dilute HF and silicon precursor, which promotes the formation of a thermodynamically stable homogenous solution regardless of conditions. Copper corrosion is prevented by the addition of copper corrosion inhibitor(s) to the etching solution.

Figure 3:
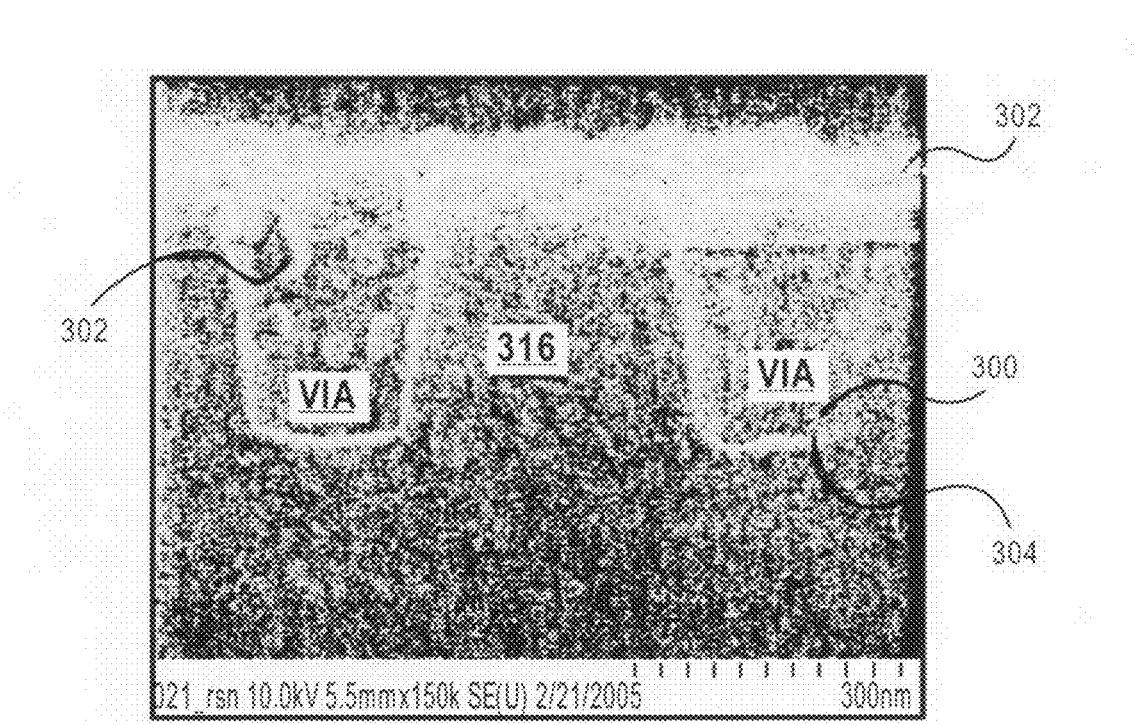
FIGS. 3-4 illustrate a cross section SEM (Scanning Electron Microscope) of a wafer that has a metal (e.g., Ti) hard mask layer to be removed.
Figure 4:
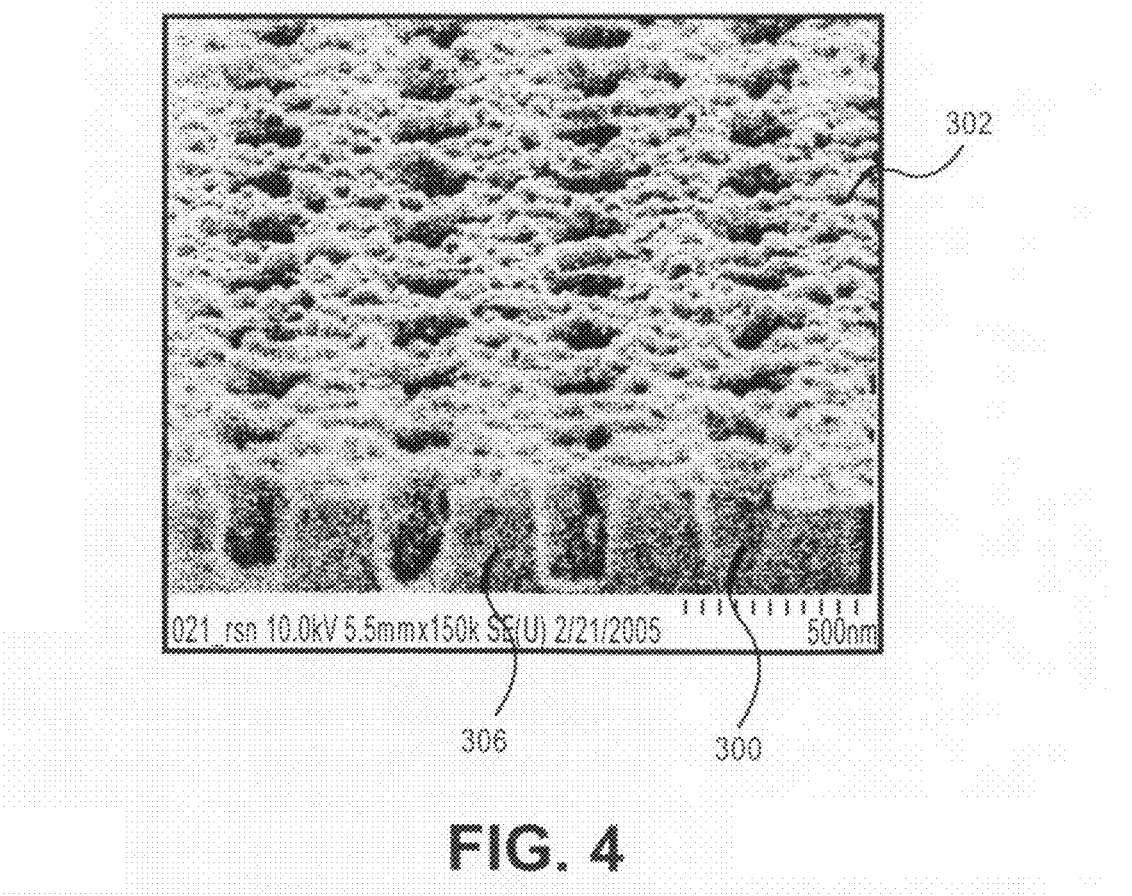

FIGS. 3-4 show an example of a wafer typically obtained or provided after vias 300 have been formed in a dielectric layer 306 that is formed on top of a device such as a transistor (not visible in these figures). In many instances, after the vias are etched into the dielectric layer 306, polymer by-products 302 are deposited or otherwise formed on top of the surface as well as in the vias. In many instances, an etch stop layer 304 made of a metal hard mask material or a material similar to those used to make a metallic hard mask is placed to protect contact below. Prior to filling the vias with conductive material(s) and forming additional metallization layers (such as those typically done in Back End Of Line processing), the polymer by-products 302 and the etch stop layer 304 would need to be removed. In one embodiment, the etching solutions made according to the embodiments of the present invention are used to remove such the polymer by-products 302 and the etch stop layer 304.

Figure 5:
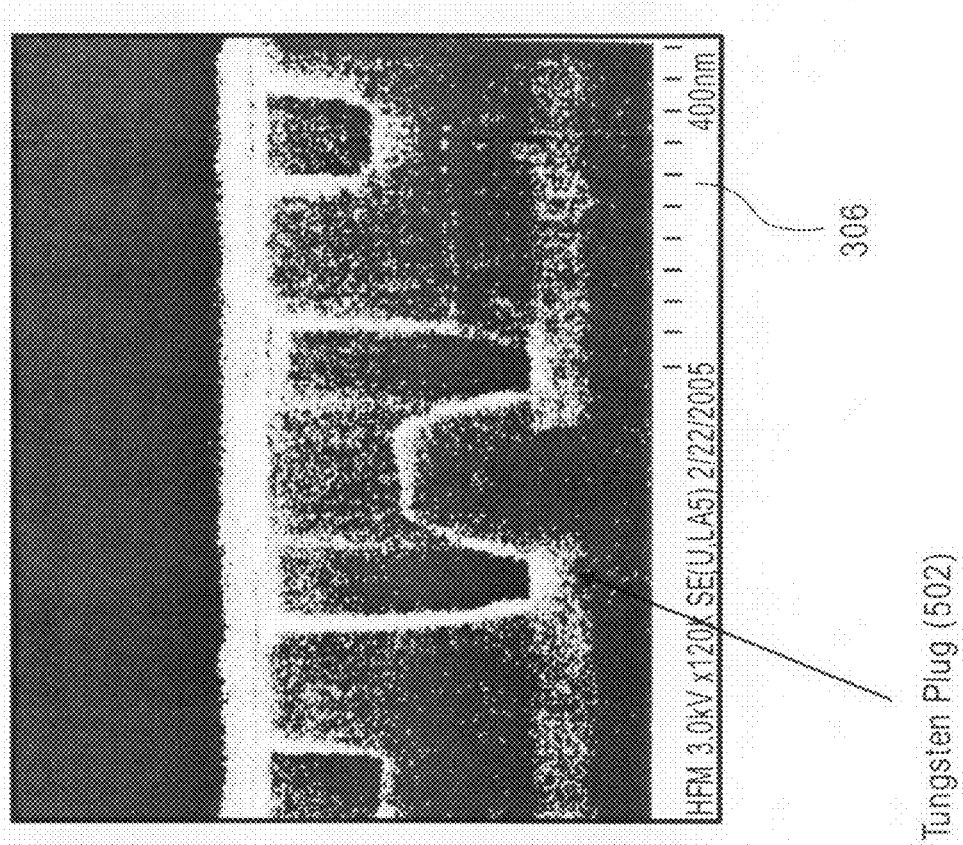
FIGS. 5-6 illustrate a cross section SEM of the wafer shown in FIGS. 3-4 after wet etch clean using a composition of the present invention with etch residues and Ti hard mask completely removed and that tungsten is intact and no adverse impact to a dielectric material.
Figure 6:
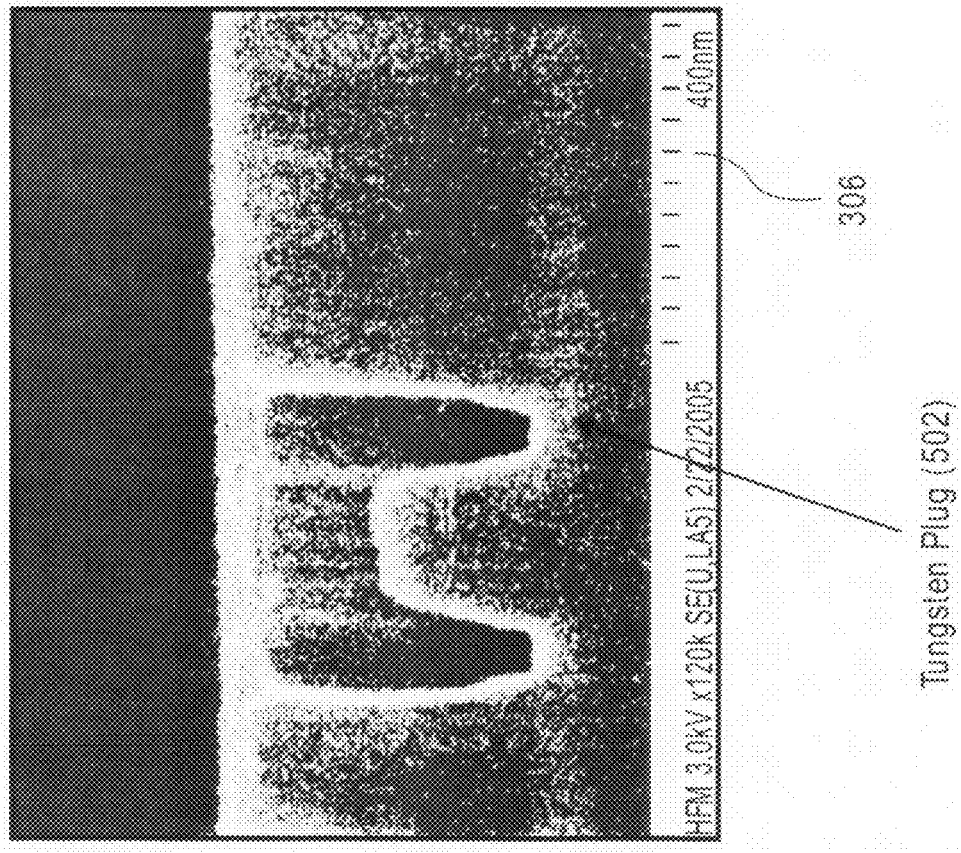

FIGS. 5-6 illustrate the wafer after being treated with an etching solution of the present invention. Note that etch residues, polymer by-products, and the Ti hard mask were completely removed and that tungsten plug 502 previously formed on the device (not shown) is intact inside the contact trench. Additionally, no adverse impact to the CDO or the dielectric layer 306 is observed.

Figure 7A:
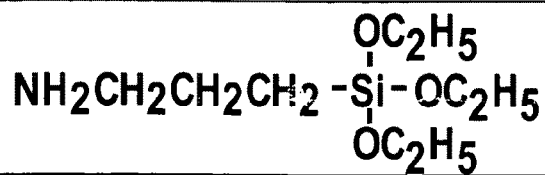
Figure 7A:
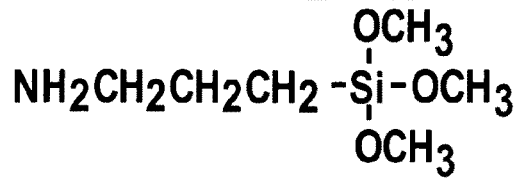
Figure 7A:
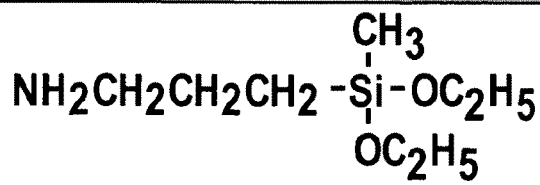
Figure 7A:
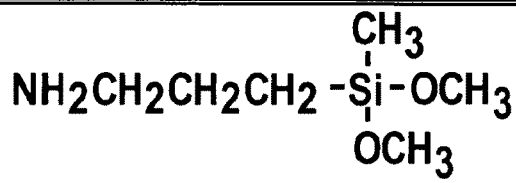
Figure 7A:
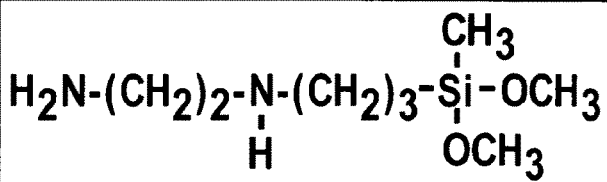
Figure 7A:
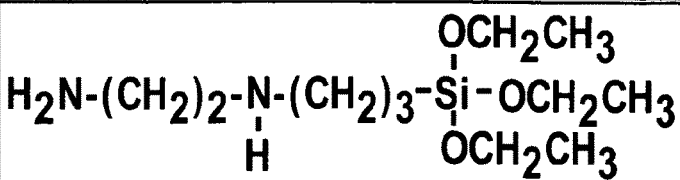
Figure 7A:
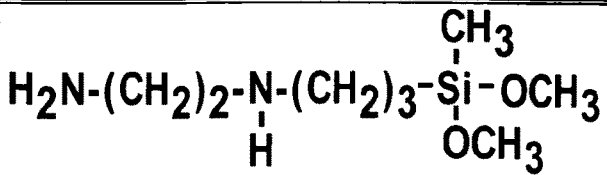
Figure 7C:
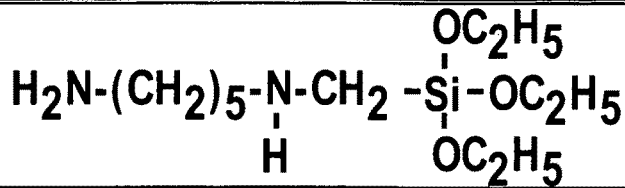
Figure 7C:
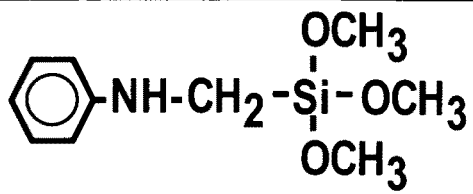
Figure 7C:
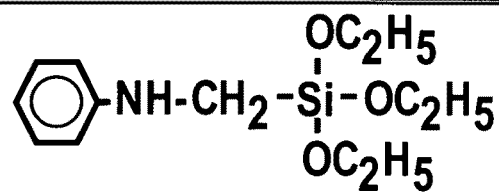
Figure 7C:
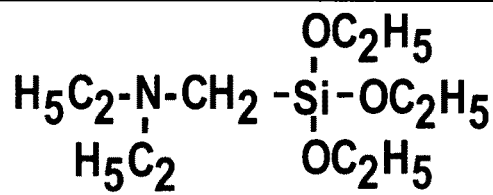
Figure 7C:
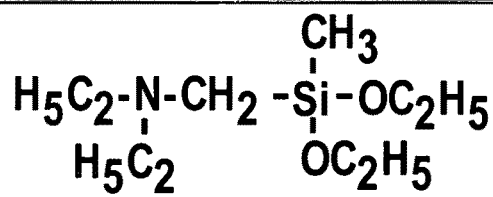
Figure 7C:
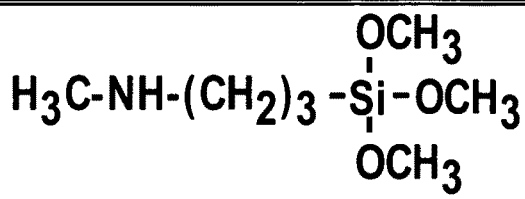
Figure 7D:
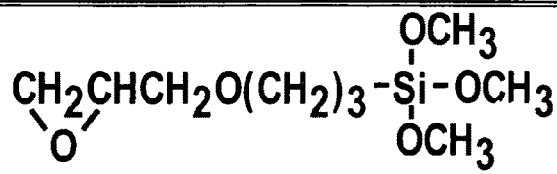
Figure 7D:
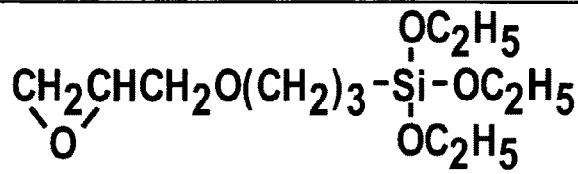
Figure 7D:
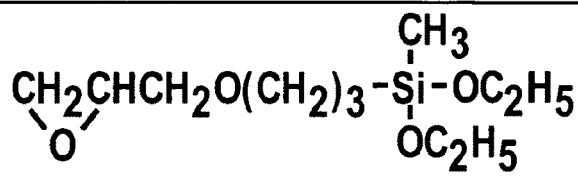
Figure 7D:
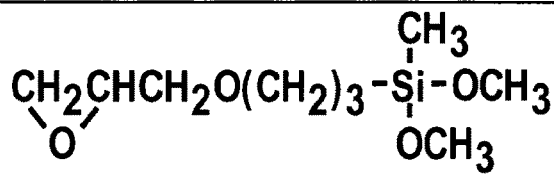
Figure 7D:
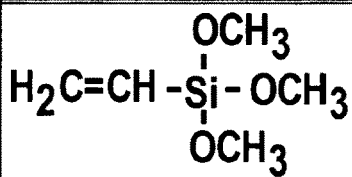
Figure 7D:
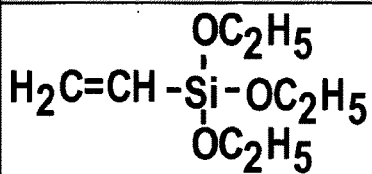
Figure 7D:
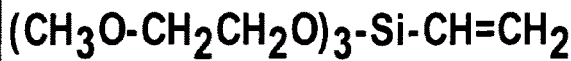
Figure 7E:
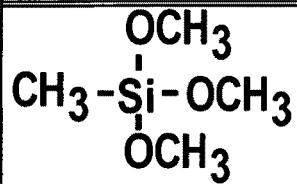
Figure 7E:
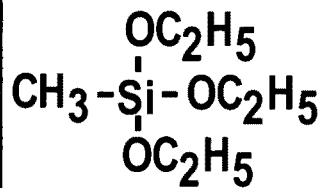
Figure 7E:
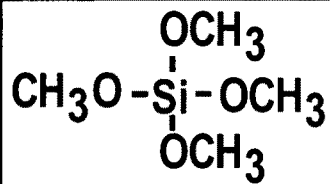
Figure 7E:
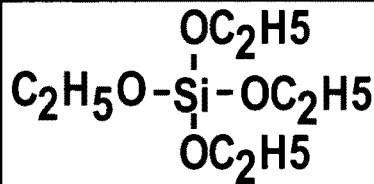
Figure 7E:
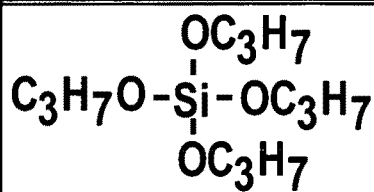
Figure 7F:
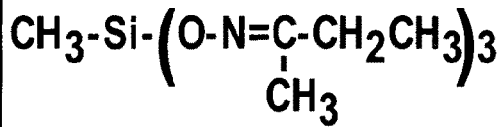
Figure 7F:
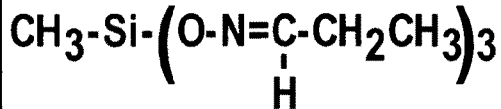
Figure 7F:
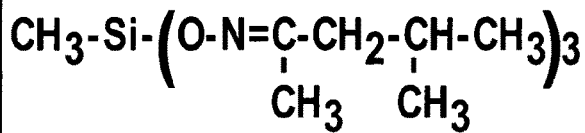
Figure 7F:
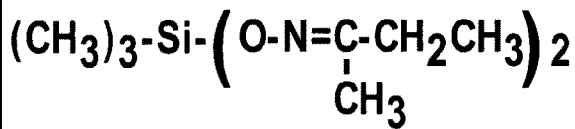
Figure 7F:
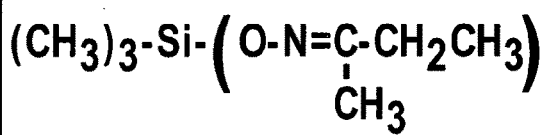
Figure 7F:
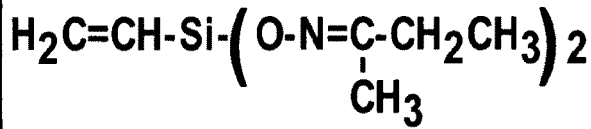
Figure 7F:
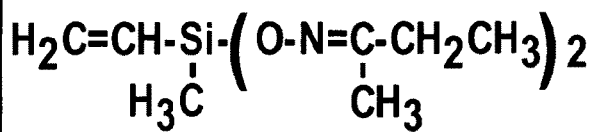
Figure 7G:
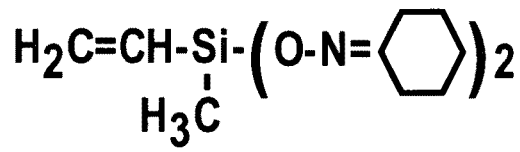
Figure 7G:
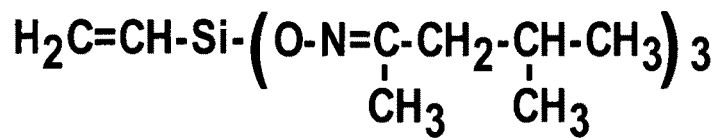
Figure 7G:
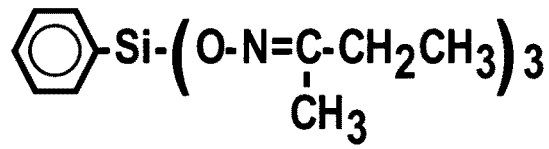
Figure 7H:
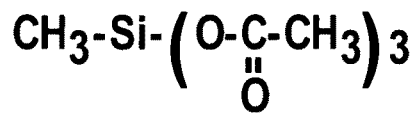
Figure 7H:
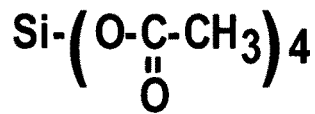

FIGS. 7A-7H illustrate the chemical structures of various silicon precursors that can be used to formulate or synthesize the etching solutions according to embodiments of the present invention. Silicon precursors that can be used for the etching solutions of the present invention include Amino Functional Silanes (FIGS. 7A-7C), Epoxy Functional Silanes (FIG. 7D), Vinyl Functional Silanes (FIG. 7D), Alkoxy Silanes (FIG. 7E), Ketoxime Silanes (FIG. 7F), and Acetoxy Silanes (FIG. 7H). Diethylsilane and Diphenylsilane can also be used (not shown).

Figure 8:
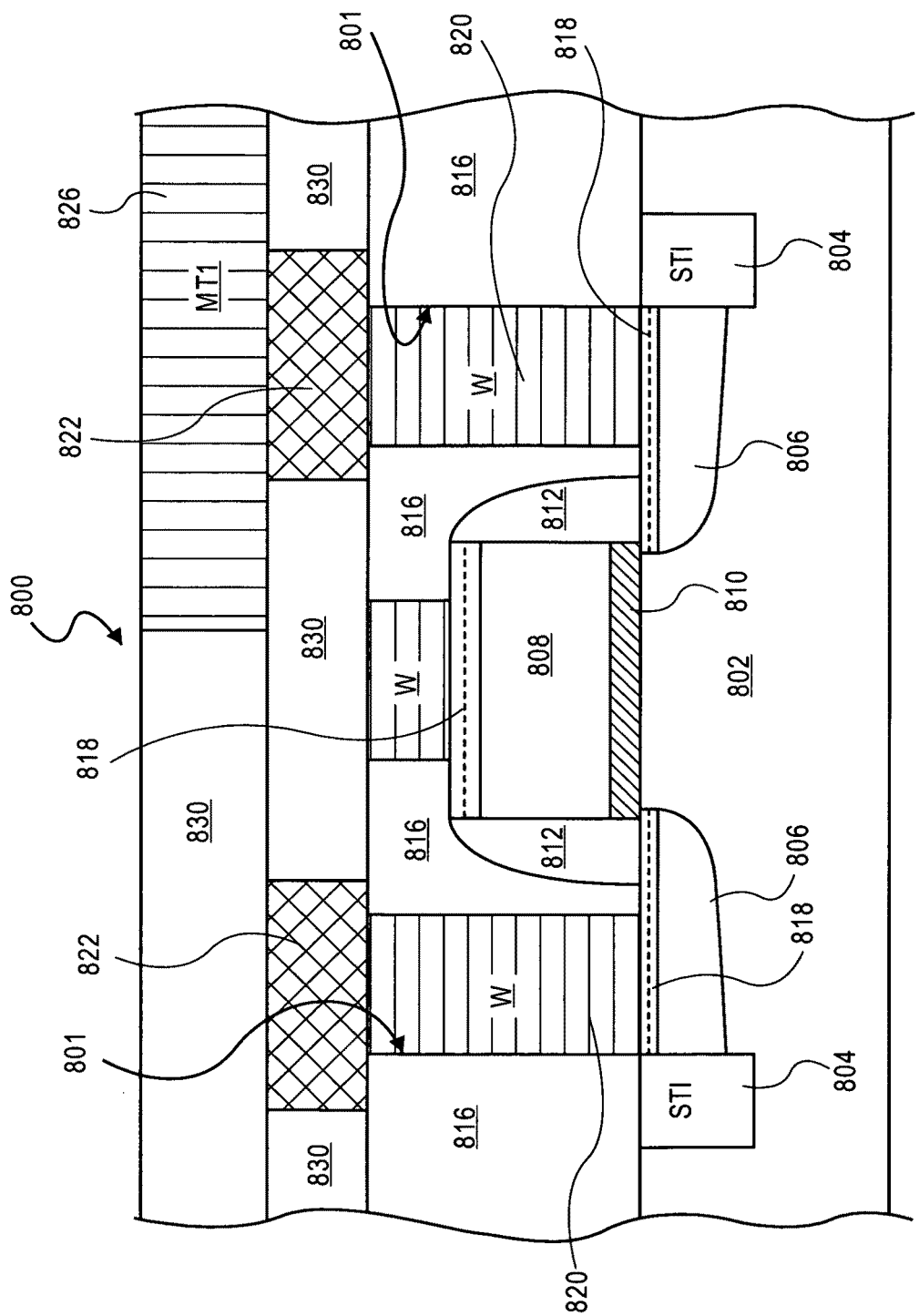
FIG. 8 illustrates a cross-sectional side view of a semiconductor device with multiple interconnect levels that can include a metal hard mask and that can benefit from the present invention.

FIG. 8 illustrates an exemplary microstructure device 800 that can be fabricated using several metal or metallic hard mask. The device 800 can be a transistor or capacitor or other semiconductor device. The device 800 is formed on a semiconductor substrate 802 (e.g., a silicon wafer). Isolation regions such as STI 804 are formed in the substrate 802 to isolate one device from another as is known in the art. Source and drain regions 806 are also formed by doping into the substrate 808 as known in the art. Between the source and drain regions 806 and on the top surface of the substrate 808, a gate dielectric 810 is formed. A gate electrode 808 is formed on top of the gate dielectric 810. Contacts to the device 800 can be made to the source and drain regions 806 and optionally, the gate electrode 808. The source/drain regions or gate electrode can sometimes be referred to as conductive surfaces so that the first contact can be made to the device 800. Often, a layer of silicide material 818 is formed over the source and drain regions 806 and optionally, the gate electrode 808 to enhance/establish the conductive contact region. The silicide layer 818 can be formed as conventionally done. When silicide layer 818 is include, the contact surfaces are the silicide surfaces. Spacer sidewalls 812 are also disposed on each side of the gate electrode 808.

Contacts are made to the device. As referred herein, the first layer of contact refers to the contact that is made immediate to the device 800 or on the top surface of the substrate 802 or as illustrated in FIG. 8 (on top of the silicide layer 818). Thus, contacts are made to the source/drain regions 806 and the gate electrode 808 (or their respective silicide layer formed thereon). In one embodiment, a dielectric layer 816 is formed on the top surface of the substrate 808. Openings 801 are formed into the dielectric layer 816 and expose the silicide layer 818. In one embodiment, the silicide layer 818 lines the bottom of each opening 801. In one embodiment, a barrier layer (not labeled) may line the entire surface (bottom surface and sidewalls) of the opening 801. The openings 801 are then filled with Tungsten (W) to form the first contact 820 using methods such as deposition, sputtering, electroplating, or electroless plating. In one embodiment, a via connector 822 is formed that connects to the first contact 820. The via connector 822 is then interconnected to one or more metallization layers (e.g., MT1 to MT8) 826 above. Methods such as dual damascene processing can be used to form the via connector 822 and the metallization layers MT1-MT8. Interlevel dielectric layers 830 are also used at each metallization layer as is known in the art.

Prior to the formation of the via for forming the via connector 822, a metallic etch stop layer may be used to protect the Tungsten first contact 820 when etchings are used to form the via for the via connector 822. Also, for forming of the via opening 801, a metallic hard mask may also be used. Similarly, a metallic etch stop layer is placed over the via connector 822 after its formation to protect the conductive material while etching is used to form the trench for the metallization line MT1. Also, dielectric layers are present throughout many processes of the fabrication. The etching solutions of the present invention can be used to selectively remove the metal hard mask material of the metallic etch stop layer prior to the deposition of the conductive materials to fill the vias or trenches. The etching solutions of the present invention has the capability to cleanly remove the metallic material such as Titanium without affect the underlying conductive materials such as Tungsten or the dielectric material such as SiO$_2$.

FIGS. 9A-9E illustrate an exemplary process of forming an interconnect in according to embodiments of the present invention. These figures illustrate a process for forming an interconnection over an underlying Tungsten or Copper interconnection. A typical integrated circuit may have, for example, four or five interconnection layers or lines each insulated form one and another by dielectric material.

Figure 9A:
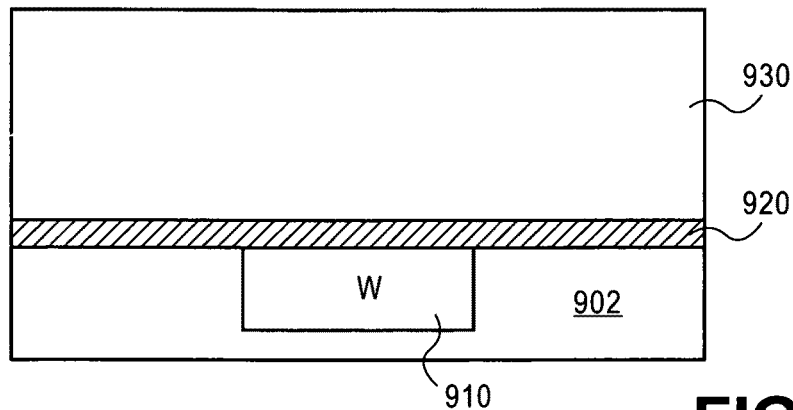
FIGS. 9A-9E illustrate an exemplary process of making a semiconductor structure utilizing a metal hard mask(s)

FIG. 9A illustrates a cross-sectional side view of a portion of an integrated circuit substrate or wafer having a first W interconnection line 910 formed in dielectric material 902. W interconnection line 910 is, for example, coupled to an underlying device or devices formed in and on a semiconductor substrate similar to previously shown in FIG. 8 (e.g., first contact 820). The dielectric material 902 is, for example, SiO$_2$ formed by a tetraethyl orthosilicate (TEOS) or plasma enhanced chemical vapor deposition (PECVD) source. In this example, dielectric layer 902 and W interconnection 910 are planarized. Overlying the planarized dielectric layer 910 and W interconnection line 910 is first metallic mask layer 920 (e.g., a Ti layer). Instead of the metallic mask layer, the layer 920 can be a conventional etch stop layer such as silicon carbide or other suitable etch stop layer as is known in the art. In one embodiment, the mask layer 920 serves, in one aspect, as a mask or barrier to prevent oxidation of W interconnection line 910 as well as an etch stop layer for the etching process to form a via or a trench above the W interconnection liner 910.

Figure 9B:
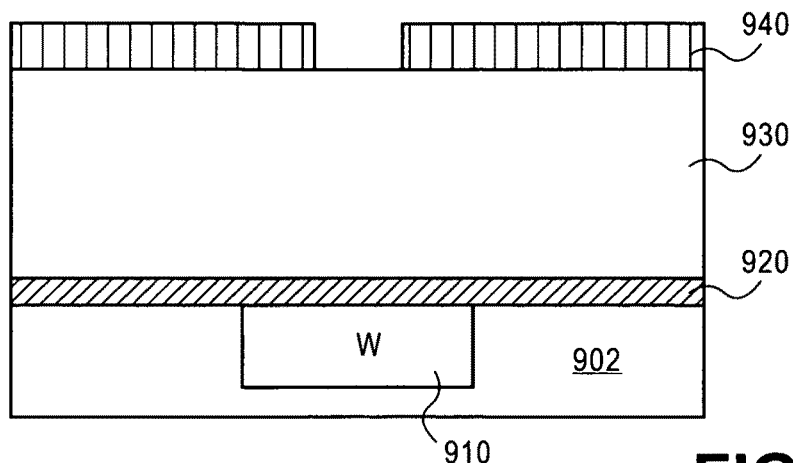
Figure 9C:
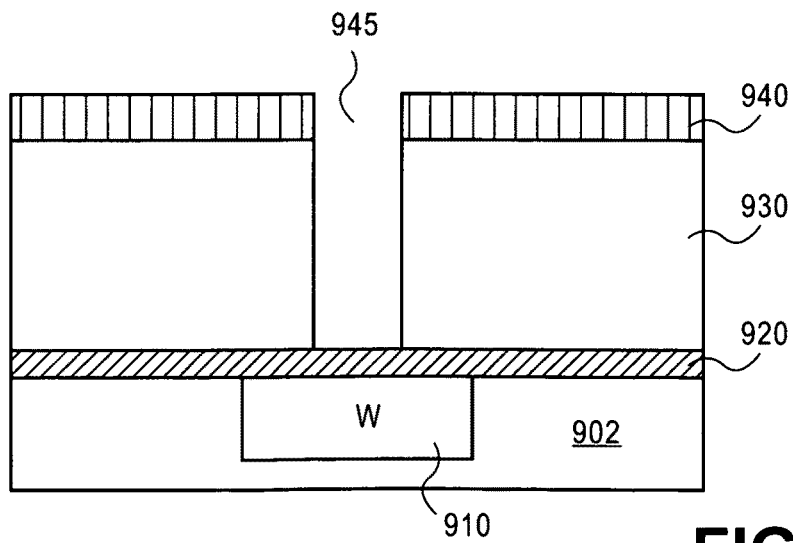

Overlying metallic mask layer 920 is second dielectric layer 930. The dielectric layer 930 is, for example, a TEOS or PECVD formed SiO$_2$. The thickness of the dielectric layer 930 will depend, in part, on size characteristics and scaling considerations for the device. Once the dielectric layer 930 is deposited and formed, the material may be planarized for example with a chemical-mechanical polish. Next, as shown in FIG. 9B, a via pattern or second mask layer 940 is patterned over dielectric layer 930. The second mask layer 940 is, for example, also a metallic mask and may also be formed with a photo-imageable material such as a photoresist (not shown). The second mask layer 940 defines an area for via or opening 945 over dielectric layer 930. The via 945 is then formed into the dielectric layer 930 as shown in FIG. 9C (by etching as conventionally done).

Figure 9D:
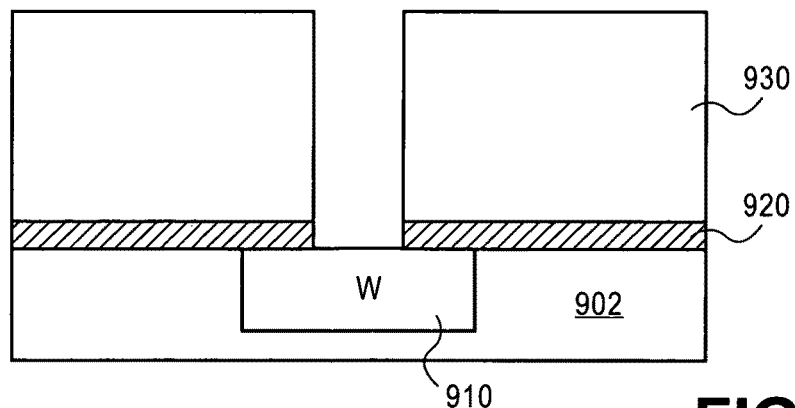
Figure 9E:
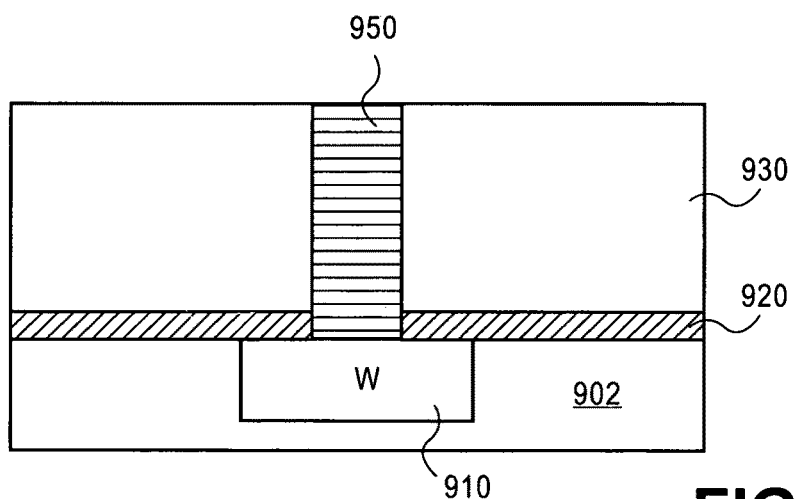

As shown in FIG. 9D, after the via 945 is formed, an etching solution made according to embodiments of the present invention is used to remove the mask layer 940 as well as a portion of the barrier mask layer 920 to expose the W interconnection line 910 below. Then, conductive material (e.g., Copper or Aluminum) can then be deposited to form interconnection 950 to the W interconnection line 910. Conventional deposition and polishing techniques can be used to complete the interconnection 950 (FIG. 9E).

FIGS. 10A-10J illustrate an exemplary dual damascene process used to form a interconnection line to copper where metal hard mask are used and an etching solution of the present invention is used to remove the hard mask when etching to form a via and trench is complete.

Figure 10A:
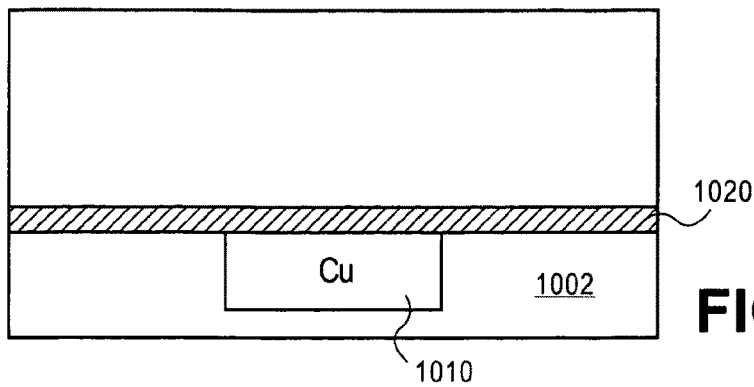
FIGS. 10A-10J illustrate another exemplary process of making a semiconductor structure utilizing a metal hard mask(s).

FIG. 10A illustrates a cross-sectional side view of a portion of an integrated circuit substrate or wafer having a first Cu interconnection line 1010 formed in dielectric material 1002. Cu interconnection line 1010 is, for example, coupled to an underlying device or devices formed in and on a semiconductor substrate similar to previously shown in FIG. 8 (e.g., via connector 822). The dielectric material 1002 is, for example, SiO$_2$ formed by a tetraethyl orthosilicate (TEOS) or plasma enhanced chemical vapor deposition (PECVD) source. In this example, dielectric layer 1002 and Cu interconnection 1010 are planarized. Overlying the planarized dielectric layer 1002 and Cu interconnection 1010 is first metallic mask layer 1020 (e.g., a Ti layer). Instead of the metallic mask layer, the layer 1020 can be a conventional etch stop layer such as silicon carbide or other suitable etch stop layer as is known in the art. In one embodiment, the mask layer 1020 serves, in one aspect, as a mask or barrier to prevent oxidation of Cu interconnection line 1010 as well as an etch stop layer for the etching process to form a via or a trench above the Cu interconnection liner 1010.

Figure 10B:
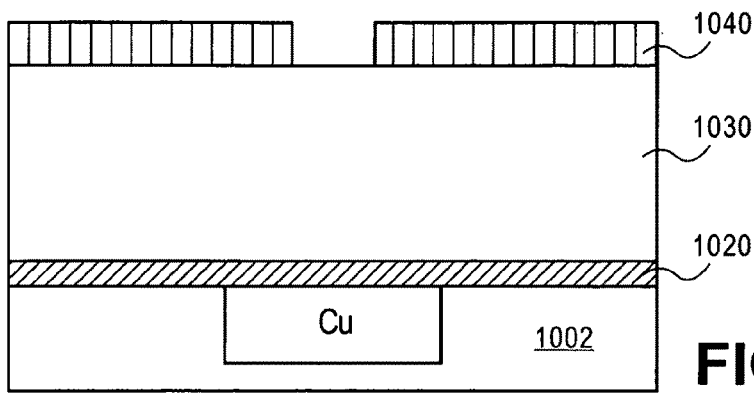
Figure 10C:
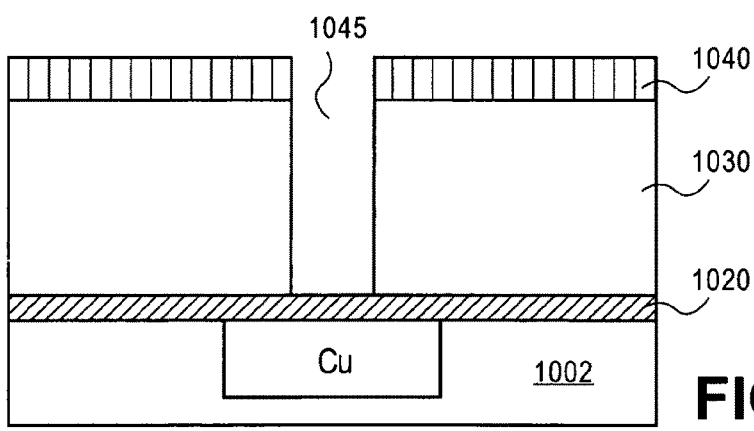

Overlying metallic mask layer 1020 is second dielectric layer 1030. The dielectric layer 1030 is, for example, a TEOS or PECVD formed SiO$_2$. The thickness of the dielectric layer 1030 will depend, in part, on size characteristics and scaling considerations for the device. Once the dielectric layer 1030 is deposited and formed, the material may be planarized for example with a chemical-mechanical polish. Next, as shown in FIG. 10B, a via pattern or second mask layer 1040 is patterned over dielectric layer 1030. The second mask layer 1040 is, for example, also a metallic mask and may also be formed with a photo-imageable material such as a photoresist (not shown). The second mask layer 1040 defines an area for via or opening 1045 over dielectric layer 1030. The via 1045 is then formed into the dielectric layer 1030 as shown in FIG. 10C (by etching as conventionally done).

Figure 10D:
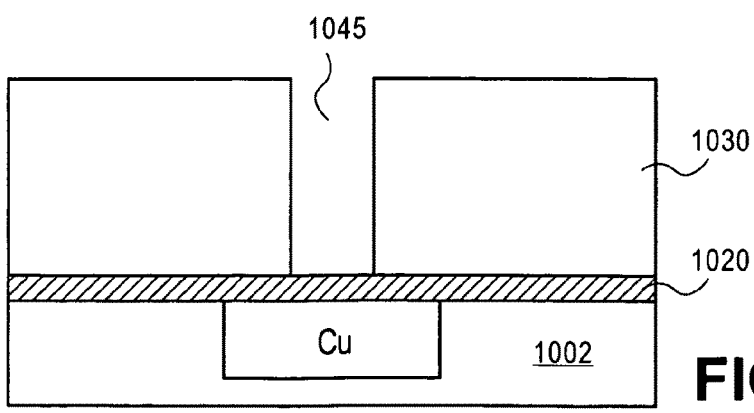

As shown in FIG. 10D, after the via 1045 is formed, an etching solution made according to embodiments of the present invention is used to remove the mask layer 1040.

Figure 10E:
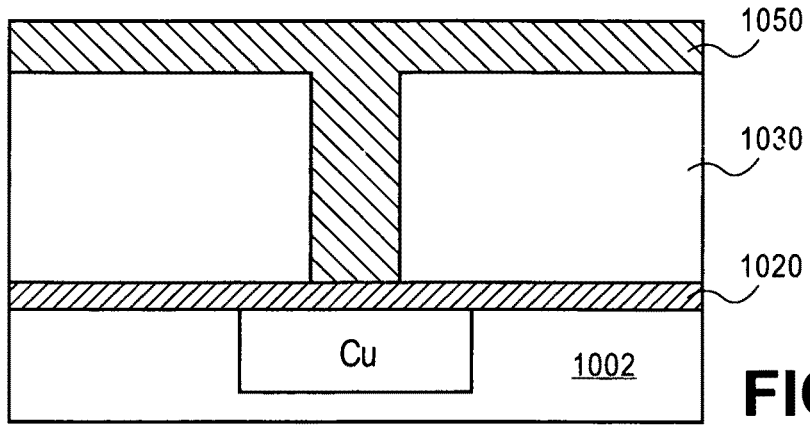
Figure 10F:
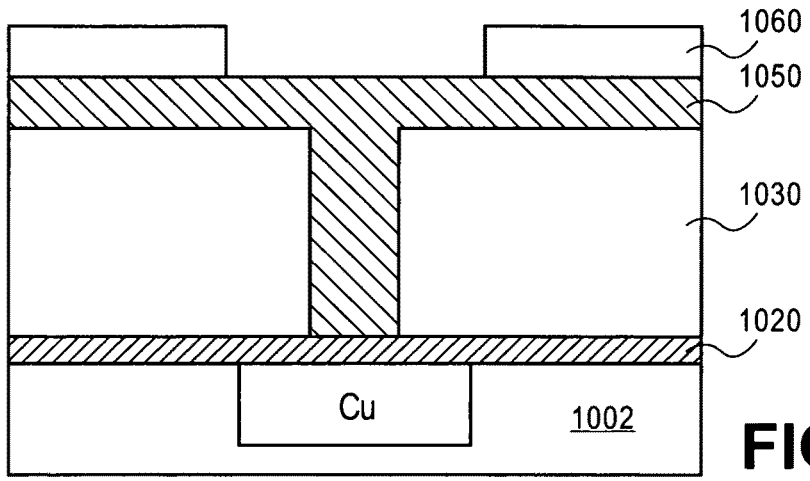
Figure 10G:
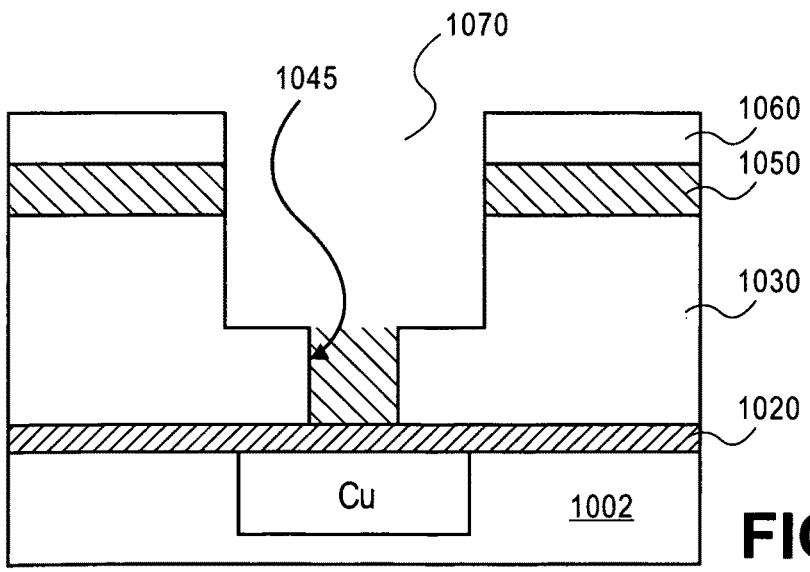

In FIG. 10E, a sacrificial light absorbing material (SLAM) 1050 is deposited over the via 1045 and the surface of the dielectric layer 1030. A SLAM 1050 has been widely used in dual damascene processing as is known in the art. Next, as shown in FIG. 10F, a trench pattern or third mask layer 1060 is patterned over the SLAM material 1050. The third mask layer 1060 is, for example, also a metallic mask and may also be formed with a photo-imageable material such as a photoresist (not shown). The third mask layer 1060 defines an area for a trench opening 1070 over dielectric layer 1030. The trench 1070 is then formed into the dielectric layer 1030 as shown in FIG. 10G (by etching as conventionally done) joining the via 1045 previously formed.

Figure 10H:
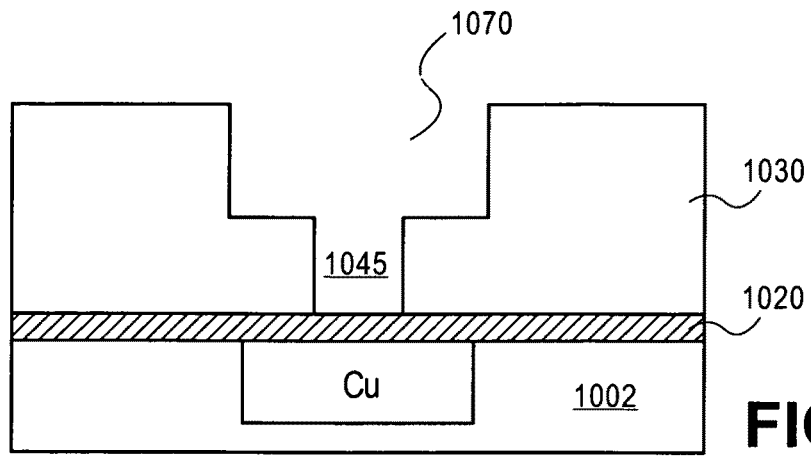

At this point, the SLAM residues 1050 as well as the third hard mask 1060 need to be removed prior to the deposition of another conductive material to form another interconnection layer. An etching solution formulated according to embodiments of the present invention can be used to remove the SLAM residues and the hard mask 1060 and the resulting structure is shown in FIG. 10H.

Figure 10I:
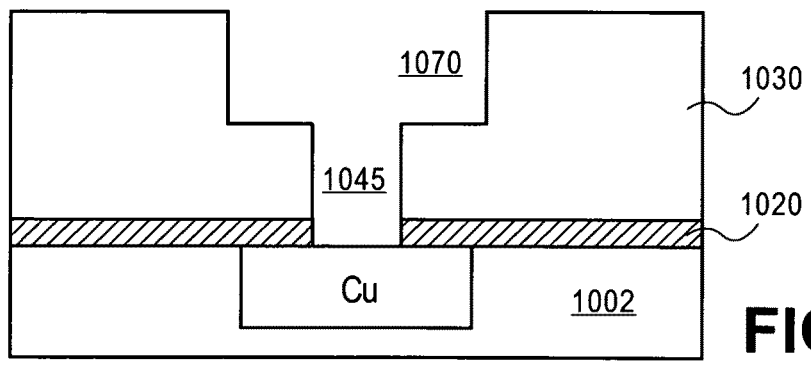
Figure 10J:
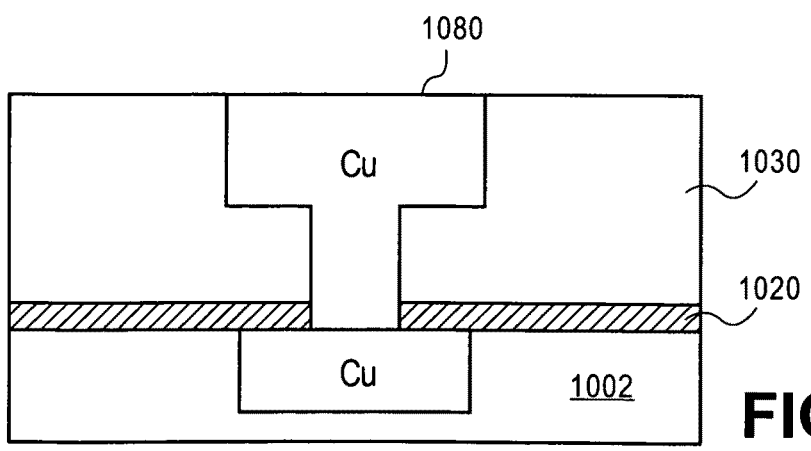

A portion of the barrier mask layer 1020 is also removed (also using an etching solution of the present invention) to expose the Cu interconnection line 1010 below (FIG. 10I). Then, conductive material (e.g., Copper or Aluminum) can then be deposited into the via 1045 and trench 1070 to form an interconnection 1080 to the Cu interconnection line 1010. Conventional deposition and polishing techniques can be used to complete the interconnection 1080 (FIG. 10J).

Embodiments of the present invention thus describe a novel etching solution that can be used to selectively removes a metal or metallic material typically used for a hard mask, etch stop layer, or other microcircuit fabrication. The etching solution can selectively remove the metallic material without affecting the underlying dielectric material such as silicon oxide or conductive interconnects such as Ti or Cu. The etching solution enables the use of a Ti hard mask in dual damascene patterning method and creates a unique application in which wet chemistries that address the selectivity requirements are not yet available. Current wet chemistry formulations designed for other applications are not cost effective for use to remove metal hard mask, offer too long of a processing time (e.g., about 70 minutes) to remove the metal hard mask, and are unsafe to handle, and even so, not as selective as desired. It is to be appreciated that etching solutions made according to the present invention have wide applicabilities where selectivity for removing a metal layer (e.g., Ti mask) over a conductive material (e.g., Cu and W) and a dielectric material is required.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method of fabricating an integrated circuit (IC) structure comprising:
    providing an IC structure comprising a dielectric layer, a conductive contact or interconnection;
    forming and patterning a metal hard mask over said dielectric layer to define a via or trench to said conductive contact or interconnection;
    forming said via or trench to said conductive contact or interconnection; and
    removing said metal hard mask using a homogenous wet etching solution that is selective to removing the metal hard mask while suppressing removal of the conductive contact or interconnection and the dielectric layer, wherein the homogenous wet etching solution comprises:
        products of a mixture of a dilute HF (hydrofluoric acid) solution and a silane containing precursor.

2. The method of claim 1, wherein said mixture comprises 0.001% to 49% by weight of the dilute HF solution, and 0.0001% to 60% by weight of the silane containing precursor, and wherein the conductive contact or interconnection comprises Tungsten.

3. The method of claim 1, wherein said homogeneous wet etching solution further comprises 0.0001% to 20% by weight of a copper corrosion inhibitor, and wherein the conductive contact or interconnection comprises Copper or Tungsten.

4. The method of claim 1 further comprising, forming an etch stop layer comprising a metallic material over said conductive contact or interconnection prior to forming said via or trench to said conductive contact or interconnection and removing at least a portion of said etch stop layer after the forming of said via or trench using said etching solution, wherein said homogenous wet etching solution is selective to removing said etch stop layer without affecting said conductive contact or interconnection and said dielectric layer.

5. The method of claim 1 wherein the products comprise silicon fluoride, silicic acid, and water.

6. The method of claim 5, wherein the homogeneous wet etching solution has a pH of 1-3.

7. The method of claim 6 wherein the silane containing precursor is selected from the group consisting of Methyltrimethoxysilane, Methyltriethoxysilane (MTES), Tetramethoxysilane (TMOS), Tetraethoxysilane (TEOS), and Tetrapropoxysilane.

8. The method of claim 7 wherein the silane containing precursor is Methyltriethoxysilane (MTES) and the silicic acid is metasilicic acid ($H_2SiO_3$).

9. The method of claim 8 wherein the products further comprise alcohol.

10. The method of claim 9 wherein the products do not comprise Methyltriethoxysilane (MTES).

11. The method of claim 10 wherein the mixture further comprises 0.0001% to 20% by weight of a copper corrosion inhibitor.

12. The method of claim 6 wherein the metal hard mask comprises titanium, and the conductive contact or interconnection comprises copper or tungsten.

13. The method of claim 1 wherein the homogeneous wet etching solution consists essentially of the products and a copper corrosion inhibitor.

14. The method of claim 13 wherein the products comprise silicon fluoride, silicic acid, and water.

15. The method of claim 14 wherein the metal hard mask comprises titanium, and the conductive contact or interconnection comprises copper or tungsten.

16. The method of claim 15 wherein the silane containing precursor is Methyltriethoxysilane (MTES).

17. The method of claim 16 wherein the products do not comprise Methyltriethoxysilane (MTES).

18. The method of claim 1, wherein the silane containing precursor is selected from the group consisting of amino functional silanes, epoxy functional silanes, vinyl functional silanes, alkoxy silanes, ketoxime silanes, acetoxy silanes, diethylsilane, and diphenylsilane.

19. The method of claim 1, wherein the silane containing precursor is Methyltriethoxysilane (MTES).

* * * * *